United States Patent
Pham et al.

(10) Patent No.: US 8,735,217 B2
(45) Date of Patent: May 27, 2014

(54) MULTIFUNCTIONAL ELECTRODE

(71) Applicants: Intermolecular Inc., San Jose, CA (US); Kabushiki Kaisha Toshiba, Tokyo (JP); SanDisk 3D LLC, Milpitas, CA (US)

(72) Inventors: Hieu Pham, Santa Clara, CA (US); Vidyut Gopal, Sunnyvale, CA (US); Imran Hashim, Saratoga, CA (US); Tim Minvielle, San Jose, CA (US); Dipankar Pramanik, Saratoga, CA (US); Yun Wang, San Jose, CA (US); Takeshi Yamaguchi, Kanagawa (JP); Hong Sheng Yang, Pleasanton, CA (US)

(73) Assignees: Intermolecular, Inc., San Jose, CA (US); Kabushiki Kaisha Toshiba, Tokyo (JP); SanDisk 3D LLC, Milpitas, CA (US)

( * ) Notice: Subject to any disclaimer, the term of this patent is extended or adjusted under 35 U.S.C. 154(b) by 0 days.

(21) Appl. No.: 14/017,942

(22) Filed: Sep. 4, 2013

(65) Prior Publication Data
US 2014/0038380 A1    Feb. 6, 2014

Related U.S. Application Data

(63) Continuation of application No. 13/367,662, filed on Feb. 7, 2012.

(51) Int. Cl.
*H01L 29/02* (2006.01)

(52) U.S. Cl.
USPC ............ 438/102; 257/2; 257/3; 257/4; 257/5; 257/E29.002; 438/103; 438/104

(58) Field of Classification Search
CPC ......... H01L 45/04; H01L 29/00; H01L 27/24; G11C 13/004
USPC .................. 257/2–5, E29.002; 438/102–104
See application file for complete search history.

(56) References Cited

U.S. PATENT DOCUMENTS

| | | | | |
|---|---|---|---|---|
| 4,405,421 | A * | 9/1983 | Inoue | 205/645 |
| 4,931,213 | A * | 6/1990 | Cass | 252/507 |
| 2005/0115828 | A1* | 6/2005 | Fanton et al. | 204/298.13 |
| 2008/0220601 | A1* | 9/2008 | Kumar et al. | 438/585 |
| 2010/0229542 | A1* | 9/2010 | Andy et al. | 60/301 |
| 2011/0070417 | A1* | 3/2011 | Reutler et al. | 428/213 |
| 2012/0028009 | A1* | 2/2012 | Gerardin et al. | 428/212 |

* cited by examiner

Primary Examiner — Jami M Valentine

(57) ABSTRACT

A nonvolatile memory element is disclosed comprising a first electrode, a near-stoichiometric metal oxide memory layer having bistable resistance, and a second electrode in contact with the near-stoichiometric metal oxide memory layer. At least one electrode is a resistive electrode comprising a substoichiometric transition metal nitride or oxynitride, and has a resistivity between 0.1 and 10 Ωcm. The resistive electrode provides the functionality of an embedded current-limiting resistor and also serves as a source and sink of oxygen vacancies for setting and resetting the resistance state of the metal oxide layer. Novel fabrication methods for the second electrode are also disclosed.

20 Claims, 8 Drawing Sheets

MULTIFUNCTIONAL ELECTRODE

CROSS-REFERENCE TO RELATED APPLICATIONS

This application is a continuation, claiming priority to U.S. patent application Ser. No. 13/367,662 filed 7 Feb. 2012, which is entirely incorporated by reference herein for all purposes.

FIELD OF THE INVENTION

One or more embodiments of the present invention relate to ReRAM devices and methods of making ReRAM devices, and more particularly to methods for forming electrodes having embedded resistor functionality.

BACKGROUND

Nonvolatile memory elements are used in systems in which persistent storage is required. For example, digital cameras use nonvolatile memory cards to store images and digital music players use nonvolatile memory to store audio data. Nonvolatile memory is also used to persistently store data in computer environments.

Nonvolatile memory is often formed using electrically-erasable programmable read only memory (EEPROM) technology. This type of nonvolatile memory contains floating gate transistors that can be selectively programmed or erased by application of suitable voltages to their terminals.

As fabrication techniques improve, it is becoming possible to fabricate nonvolatile memory elements with increasingly smaller dimensions. However, as device dimensions shrink, scaling issues are posing challenges for traditional nonvolatile memory technology. This has led to the investigation of alternative nonvolatile memory technologies, including resistive switching nonvolatile memory known in array form as resistive random access memory or ReRAM.

Resistive switching nonvolatile memory is formed using memory elements that have two or more stable states with different resistances. Bistable memory has two stable states. A bistable memory element can be placed in a high resistance state or a low resistance state by application of suitable voltages or currents. Voltage pulses are typically used to switch the memory element from one resistance state to the other. Nondestructive read operations can be performed to ascertain the value of a data bit that is stored in a memory cell.

Resistive switching based on transition metal oxide switching elements formed of metal oxide layers has been demonstrated. Although metal oxide layers such as these exhibit bistability, the resistance of these layers and/or the ratio of the high-to-low resistance states is (are) often insufficient to be of use within a practical nonvolatile memory device. For instance, the resistance states of the metal oxide layer should preferably be significant as compared to that of the system (e.g., the memory device and associated circuitry) so that any change in the resistance state change is perceptible. Since the variation in the difference in the resistive states is related to the resistance of the resistive switching layer, it is often hard to use a low resistance metal oxide layer to form a reliable nonvolatile memory device. For example, in a nonvolatile memory that has conductive lines formed of a relatively high resistance metal such as tungsten, the resistance of the conductive lines may overwhelm the resistance of the metal oxide resistive switching element if its resistance was not sufficiently high. It may be difficult or impossible to sense the state of the bistable metal oxide resistive switching element.

Similar issues can arise from integration of the resistive switching memory element with current steering elements, such as diodes or transistors. The resistance of the resistive switching memory element (at least in its high resistance state) is preferably significant compared to the resistance of the current steering elements, so that the unvarying resistance of the current steering element does not dominate the resistance of the switching memory element, and thus reduce the measurable difference between the "on" and "off" states of the formed memory device (i.e., logic states of the device). However, since the power that can be delivered to a circuit containing a series of resistive switching memory elements and current steering elements is typically limited in most conventional nonvolatile memory devices (e.g., CMOS driven devices), it is desirable to form each of the resistive switching memory elements and current steering elements in the circuit so that the voltage drop across each of these elements is small, and thus resistance of the series connected elements does not cause the current to decrease to an undesirable level due to the fixed applied voltage (e.g., ~2-5 V).

As nonvolatile memory device sizes shrink, it is important to reduce the required currents and voltages that are necessary to reliably set, reset and/or determine the desired "on" and "off" states of the device to minimize overall power consumption of the memory chip as well as resistive heating of the device and cross-talk between adjacent devices. Moreover, as nonvolatile memory device sizes shrink it becomes increasingly necessary to assure that the "set" and "reset" currents used to change the state of the memory element are not too large so as to require higher voltage transistors for chip control circuitry, as well to minimize damage to or alter the electrical or physical properties of the one or more layers found in the formed memory device. A large current flowing through the current carrying lines in a memory array can also undesirably alter or disturb the memory state of other interconnected devices or possibly damage portions of the adjacently connected devices, due to an appreciable amount of "cross-talk" created between them due to resistive heat transfer. Therefore, there is a need to limit and/or minimize the required current used to sense and program the logic states of each of the interconnected devices in an effort to reduce chip overall power consumption as well as improve device longevity and reduce the chance that cross-talk between adjacently connected devices, which can alter a nonvolatile memory's device state. Therefore, it is desirable to form a nonvolatile memory device that has low programming currents when switching the device between the "on" and "off" states.

The addition of individual current limiting resistors for each memory element can reduce the required programming currents. These current-limiting resistors are typically formed by adding a second layer of a fixed resistive material adjacent to the bistable resistive material forming the memory elements, as is disclosed in co-owned U.S. patent application Ser. No. 13/353,000 entitled "Nonvolatile Memory Device Having A Current Limiting Element" filed on Jan. 18, 2012, which claims priority to U.S. Provisional Patent Application No. 61/513,355 entitled "Nonvolatile Memory Device Having A Current Limiting Element," filed on Jul. 29, 2011, both of which are incorporated herein by reference. This extra layer requires an additional process step.

SUMMARY OF THE INVENTION

Embodiments of the present invention include nonvolatile memory elements and methods of preparing them. The nonvolatile memory elements comprise a first layer operable as a first electrode, and a second layer operable as a resistive switching layer. The second layer comprises a compound comprising $Me^1{}_v Me^2{}_w Si_x O_y N_z$, where $Me^1$ and $Me^2$ are metals, $v \geq 0$, $w \geq 0$, $x \geq 0$, $y > 0$, and $z \geq 0$, and at least one of v, w, and x is greater than zero, having near-stoichiometric composition and bistable resistance. The memory element further comprises a third layer, wherein the third layer is operable as a second electrode. At least one of the first layer or the third layer is a resistive layer comprising a substoichiometric nitride or substoichiometric oxynitride, and having a resistivity between 0.1 and 10 Ωcm. In some embodiments, the resistive layer is in contact with the second layer. In some embodiments, both the first layer and the third layer are resistive layers. In some embodiments, the resistive layer is operable as a source of oxygen vacancies that can migrate into the second layer during the set cycle, and is operable as a sink for oxygen vacancies that can migrate out of the second layer during the reset cycle. In some embodiments, the second layer comprises a transition metal oxide or transition metal oxynitride. In some embodiments, the resistive layer comprises a transition metal nitride or transition metal oxynitride. The transition metal can comprise hafnium, tantalum, zirconium, lanthanum, niobium, or tungsten. The metals, $Me^1$ and $Me^2$, can each be selected from the group consisting of tantalum, niobium, hafnium, yttrium, zirconium, lanthanum, vanadium, titanium, tungsten, nickel, and aluminum.

Novel fabrication methods for the nonvolatile memory elements and the resistive electrodes are also disclosed. The resistive layers comprising a substoichiometric nitride or substoichiometric oxynitride can be formed by reactive sputtering in an atmosphere comprising nitrogen or a combination of nitrogen and oxygen. Typically, the atmosphere has a total pressure between about 1 and about 5 mTorr. In some embodiments, the atmosphere has a total pressure between about 10 and about 50 mTorr. In some embodiments, the substoichiometric nitride or substoichiometric oxynitride is formed by reactive sputtering wherein the sputtered atoms impinge on the growing second electrode layer at an incident angle greater than about 55 degrees relative to the surface normal. In some embodiments, the substoichiometric nitride or substoichiometric oxynitride is formed by reactive sputtering wherein a substrate bias voltage is set substantially higher than a bias voltage at which a minimum resistivity occurs in the substoichiometric transition metal nitride or substoichiometric oxynitride. The second layer comprises a transition metal oxide or transition metal oxynitride. The transition metal comprises hafnium, tantalum, zirconium, lanthanum, niobium, or tungsten. $Me^1$ and $Me^2$ can each be selected from the group consisting of tantalum, niobium, hafnium, yttrium, zirconium, lanthanum, vanadium, titanium, tungsten, nickel, and aluminum. The resistive layer comprises a transition metal nitride or transition metal oxynitride. Process control for reactive sputtering of the second electrode layer can be improved by using increased carrier gas pressure, detuning the substrate bias, or using an oblique incident angle for the metal atoms.

DETAILED DESCRIPTION

Figure 1:
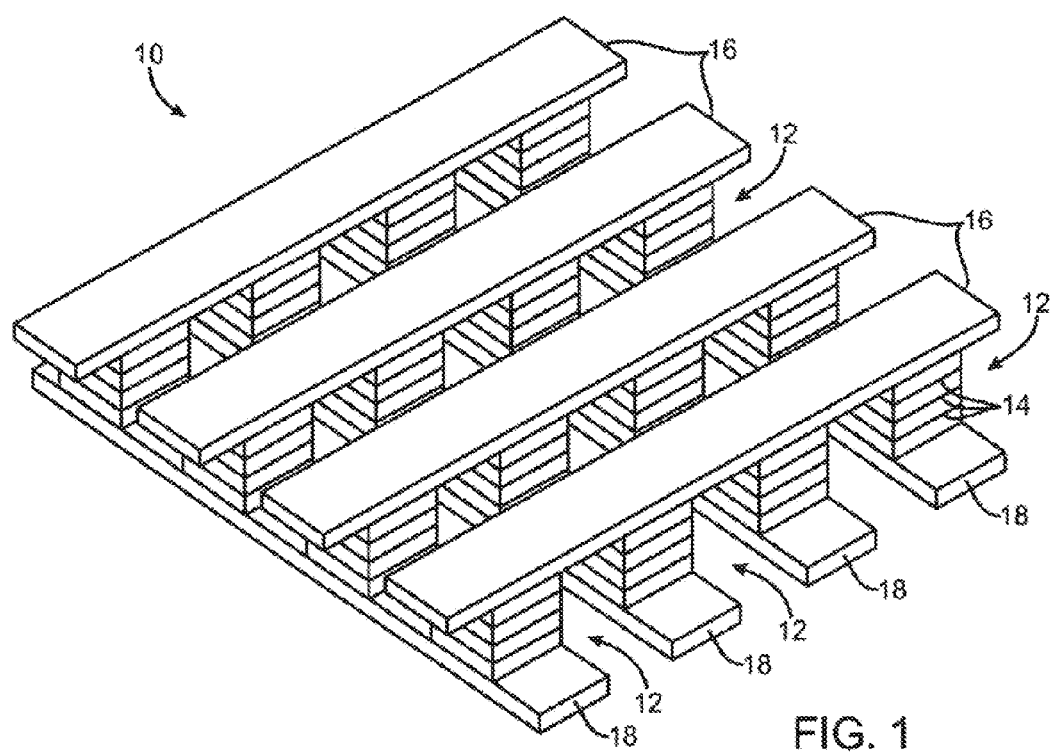
FIG. 1 shows a diagram of an illustrative array of resistive switching nonvolatile memory elements.

Before the present invention is described in detail, it is to be understood that unless otherwise indicated this invention is not limited to specific resistive switching layer compositions. Exemplary embodiments will be described for a plurality of layers comprising $Ta_2O_{5-\delta}$ (near stoichiometric, bistable resistance) layers and $TaO_{2.5-x}$ (substoichiometric, resistive) layers, but bilayers and multilayers comprising stoichiometric, near-stoichiometric, and substoichiometric oxides, nitrides, and oxynitrides of any metal or silicon can beneficially be produced using the methods disclosed herein. It is also to be understood that the terminology used herein is for the purpose of describing particular embodiments only and is not intended to limit the scope of the present invention.

It must be noted that as used herein and in the claims, the singular forms "a," "and" and "the" include plural referents unless the context clearly dictates otherwise. Thus, for example, reference to "a layer" includes two or more layers, and so forth.

Where a range of values is provided, it is understood that each intervening value, to the tenth of the unit of the lower limit unless the context clearly dictates otherwise, between the upper and lower limit of that range, and any other stated or intervening value in that stated range, is encompassed within the invention. The upper and lower limits of these smaller ranges may independently be included in the smaller ranges, and are also encompassed within the invention, subject to any specifically excluded limit in the stated range. Where the stated range includes one or both of the limits, ranges excluding either or both of those included limits are also included in the invention. Where the modifier "about" is used, the stated quantity may vary by ±10%. Where the modifier "substantially higher" is used, the larger quantity is understood to be at least 20% larger in value than the smaller quantity.

DEFINITIONS

As used herein, the term "near-stoichiometric" refers to compounds where the atomic ratio deviates only slightly from the stoichiometrically correct ratio (wherein valence electrons are all balanced). For near-stoichiometric metal oxides described herein, there is typically a slight deficit of oxygen atoms relative to that of the fully oxidized metal, that deficit being sufficient to create defects in the lattice and a bistable resistance characteristic in sufficiently thin layers. For notational convenience, such near-stoichiometric oxides are abbreviated by adding a "-δ" after the number of oxygen atoms in an otherwise stoichiometric formula (e.g., $Ta_2O_{5-\delta}$). Much as with semiconductor doping, very small concentrations (<0.01%) of "defects" in the form of missing 0 atoms can be sufficient to create thin layers with bistable resistance. (Many authors use $Ta_2O_{5-x}$ instead of $Ta_2O_{5-\delta}$; δ is used in lieu of x herein to help clarify whether a near-stoichiometric or substoichiometric oxide is meant.) These near-stoichiometric layers provide the resistive switching functionality of the resistive switching nonvolatile memory elements described herein.

As used herein, the term "substoichiometric" refers to compounds where the atomic ratio deviates significantly (more than 0.01%) from the stoichiometrically correct ratio. For substoichiometric oxides described herein, there is a larger deficit of oxygen atoms (compared to near-stoichiometric oxides) sufficient to create continuous permanent strings of defects in the lattice and a linear resistance characteristic. For notational convenience, such oxides are abbreviated by adding a "-x" after the relative number of oxygen atoms in a formula where the count of metal atoms is taken to be 1 (e.g., $TaO_{2.5-x}$). Substoichiometric nitrides exhibit resistive behavior in comparison with their base metals.

As used herein, the term "conductor" refers to a volume of material (such as a wire, thin layer, or electrode) comprising a "conductive material." The material is said to be "conductive" if there is negligible voltage drop across the conductor at operating currents. In certain instances, a small voltage drop is acceptable, although typically the voltage drop across adjacent components is much larger.

Embodiments of the present invention include nonvolatile memory elements that can be formed without the need for a separate current-limiting resistor layer and process step by combining the functionality of a current-limiting resistor with one of the electrodes of a nonvolatile memory element. Accordingly, embodiments of the present invention relate to nonvolatile memory formed from resistive switching memory elements. Embodiments of the invention also relate to fabrication methods that may be used to form nonvolatile memory having resistive switching memory elements.

Resistive switching elements may be formed on any suitable type of integrated circuit. Most typically, resistive switching memory elements may be formed as part of a high-capacity nonvolatile memory integrated circuit. Nonvolatile memory integrated circuits are often used as data storage devices in portable and non-portable computing machines as well as portable devices such as digital cameras, mobile telephones, handheld computers, vehicles, appliances, and music players. Nonvolatile memory devices are packaged in memory cards or memory keys that can be removably installed in electronic equipment by a user.

The use of resistive switching memory elements to form memory arrays on memory devices is merely illustrative. In general, any suitable integrated circuit may be formed using the resistive switching structures of the present invention. Fabrication of memory arrays formed of resistive switching memory elements is described herein as an example.

Memory arrays formed of resistive switching memory elements are known as "resistive random access memory" or "ReRAM." In certain embodiments, the first electrodes of each nonvolatile memory element are coplanar and arranged as a first set of parallel electrodes, and the second electrodes of each nonvolatile memory element are coplanar and arranged as a second set of parallel electrodes at an angle to the first set of parallel electrodes.

An illustrative memory array 10 of resistive switching memory elements 12 is shown in FIG. 1. Memory array 10 may be part of a memory device or other integrated circuit. Read and write circuitry is connected to memory elements 12 using conductors 16 and orthogonal conductors 18. Conductors such as conductors 16 and conductors 18 are sometimes referred to as word lines and bit lines and are used to read and write data into the elements 12 of array 10. Individual memory element 12 or groups of memory elements 12 can be addressed using appropriate sets of conductors 16 and 18. Memory element 12 may be formed from one or more layers of materials, as indicated schematically by lines 14 in FIG. 1. In addition, the memory arrays shown can be stacked in a vertical fashion to make multi-layer 3-D memory arrays.

During a read operation, the state of a memory element 12 can be sensed by applying a sensing voltage to an appropriate set of conductors 16 and 18. Depending on its history, a memory element that is addressed in this way may be in either a high resistance state or a low resistance state. The resistance of the memory element therefore determines what digital data is being stored by the memory element. If the memory element has a high resistance, for example, the memory element may be said to contain a logic one (i.e., a "1" bit). If, on the other hand, the memory element has a low resistance, the memory element may be said to contain a logic zero (i.e., a "0" bit). During a write operation, the state of a memory element can be changed by application of suitable write signals to an appropriate set of conductors 16 and 18.

Figure 2A:
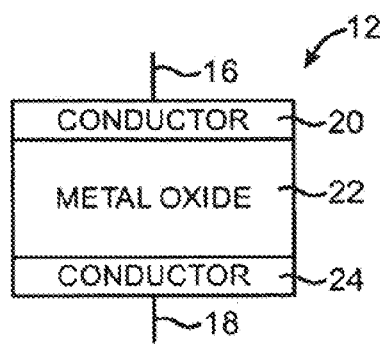
FIG. 2A is a cross-sectional view of an illustrative resistive switching nonvolatile memory element.

A cross-section of an illustrative embodiment of a resistive switching memory element is shown in FIG. 2A. In the example of FIG. 2A, memory element 12 (as shown in FIG. 1) is formed from a metal oxide memory layer 22 and has conductive electrodes 20 and 24. When constructed as part of an array such as array 10 of FIG. 1, conductive lines such as lines 16 and 18 may be physically and electrically connected to electrodes 20 and 24. Such conductive lines may be formed from any suitable metals (e.g., tungsten, aluminum, copper, metal silicides, etc.). Conductive lines 16 and 18 may also be formed from other conductive materials (e.g., doped polysilicon, doped silicon, etc.), combinations of these materials, or any other suitable conductive material. If desired, conductive line 16 and conductive line 18 may serve as both conductive lines and as electrodes. In this type of arrangement, line 16 may serve as electrode 20, so that no separate conductor is needed to form an upper electrode for element 12. Similarly, line 18 may serve as electrode 24, so that no separate conductor is needed for the lower electrode of element 12.

In the diagram of FIG. 2A, conductive lines 16 and 18 are shown schematically as being formed in contact with electrodes 20 and 24. Other arrangements may be used if desired. For example, there may be intervening electrical components (e.g., resistors, diodes, transistors, etc.) that are formed between line 16 and electrode 20 or between line 18 and electrode 24.

Figure 2B:
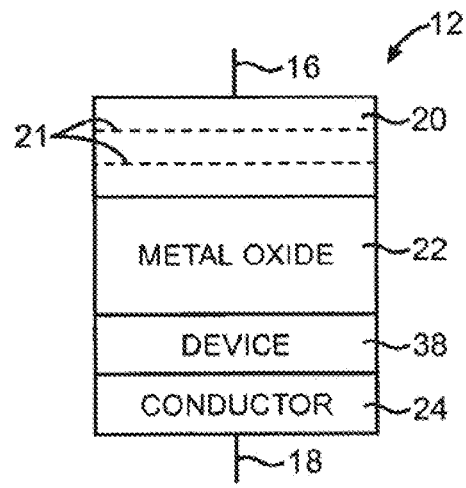
FIG. 2B is a cross-sectional view of an illustrative resistive switching nonvolatile memory element.

If desired, there may be an intervening electrical component between an electrode and resistive switching layer 22. An illustrative arrangement in which there is an intervening electrical component 38 between electrode 24 and metal oxide 22 is shown in FIG. 2B.

As indicated schematically by dotted lines 21, conductive materials such as electrodes 24 and 20 may be formed from one or more layers of materials. Examples of materials that may be used to form electrodes 20 and 24 include metal (e.g., refractory or transition metals), metal alloys, metal nitrides (e.g., refractory metal nitrides), metal silicon nitrides (i.e., materials containing refractory metals, transition metals, or other metals, along with silicon, and nitrogen), metal silicides, or other conductors. A titanium nitride layer or similar barrier layer under lower electrode 24 can be added to prevent metals and other doping and alloying elements from diffusing into an underlying silicon structure.

Resistive switching memory element 12 exhibits a bistable resistance. When resistive switching memory element 12 is in a high resistance state, it may be said to contain a logic one. When resistive switching memory element 12 is in a low resistance state, it may be said to contain a logic zero. (If desired, high resistance can signify a logic zero and low resistance can signify a logic one.) The state of resistive switching memory element 12 may be sensed by application of a sensing voltage. When it is desired to change the state of resistive switching memory element 12, read and write circuitry may apply suitable control signals across terminals 16 and 18.

Figure 3:
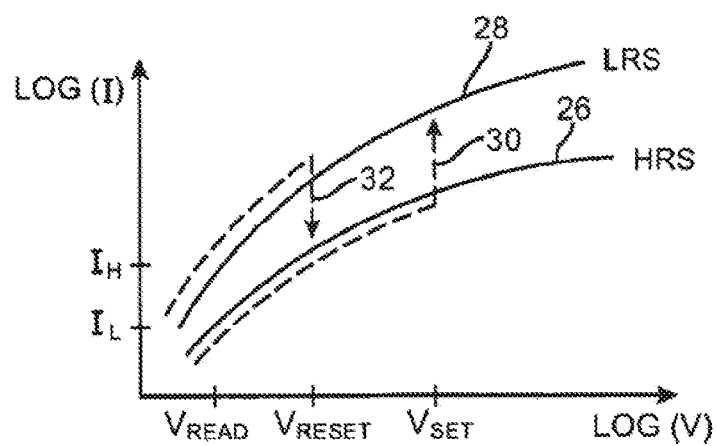
FIG. 3 shows a graph illustrating how a resistive switching nonvolatile memory element of the types shown in FIGS. 2A and 2B may exhibit bistable behavior.

A current (I) versus voltage (V) plot for memory element 12 is shown in FIG. 3. Initially, memory element 12 may be in a high resistance state (e.g., storing a logic one). In this state, the current versus voltage characteristic of memory element 12 is represented by solid line HRS 26. The high resistance state of memory element 12 can be sensed by read and write circuitry. For example, read and write circuitry may apply a read voltage $V_{read}$ to memory element 12 and can sense the resulting low current $I_L$ that flows through memory element 12. When it is desired to store a logic zero in memory element 12, memory element 12 can be placed into its low-resistance state. This may be accomplished by using read and write circuitry to apply a voltage $V_{set}$ across terminals 16 and 18 of memory element 12. Applying $V_{set}$ to memory element 12 causes memory element 12 to enter its low resistance state, as indicated by dotted line 30. In this region, the structure of memory element 12 is changed (e.g., through the formation of current filaments through memory layer 22 or other suitable mechanisms), so that, following removal of the voltage $V_{set}$, memory element 12 is characterized by low resistance curve LRS 28.

The low resistance state of memory element 12 can be sensed using read and write circuitry. When a read voltage $V_{read}$ is applied to resistive switching memory element 12, read and write circuitry will sense the relatively high current value $I_H$, indicating that memory element 12 is in its low resistance state. When it is desired to store a logic one in memory element 12, the memory element can once again be placed in its high resistance state by applying a voltage $V_{reset}$ to memory element 12. When read and write circuitry applies $V_{reset}$ to memory element 12, memory element 12 enters its high resistance state HRS, as indicated by dotted line 32. When the voltage $V_{reset}$ is removed from memory element 12, memory element 12 will once again be characterized by high resistance line HRS 26. Typical values of $V_{set}$ and $V_{reset}$ can be in the range 1-4 V, and $V_{read}$ can be about 0.5 V.

The bistable resistance of resistive switching memory element 12 makes memory element 12 suitable for storing digital data. Because no changes take place in the stored data in the absence of application of the voltages $V_{set}$ and $V_{reset}$, memory formed from elements such as memory element 12 is nonvolatile.

Any suitable read and write circuitry and array layout scheme may be used to construct a nonvolatile memory device from resistive switching memory elements such as memory element 12. For example, horizontal and vertical lines 16 and 18 may be connected directly to the terminals of resistive switching memory elements 12. This is merely illustrative. If desired, other electrical devices may be associated with each memory element 12.

Figure 4:
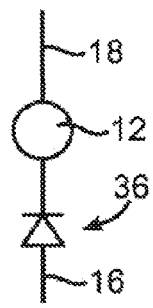
FIG. 4 is a schematic diagram of an illustrative resistive switching nonvolatile memory element in series with a diode.

An example is shown in FIG. 4. As shown in FIG. 4, a diode 36 may be placed in series with resistive switching memory element 12. Diode 36 may be a Schottky diode, a p-n diode, a p-i-n diode, or any other suitable diode.

Figure 5:
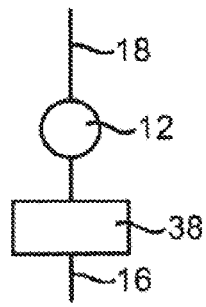
FIG. 5 is a schematic diagram of an illustrative resistive switching memory element in series with an electrical device.
Figure 6:
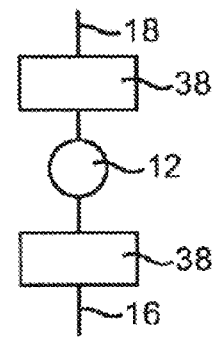
FIG. 6 is a schematic diagram of an illustrative resistive switching memory element in series with two electrical devices.

If desired, other electrical components can be formed in series with resistive switching memory element 12. As shown in FIG. 5, electrical device 38 may be placed in series with resistive switching memory element 12. Device 38 may be a resistor, a diode, a transistor, or any other suitable electronic device. Because devices such as these can rectify or otherwise alter current flow, these devices are sometimes referred to as rectifying elements or current steering elements. As shown in FIG. 6, two electrical devices 38 may be placed in series with a resistive switching memory element 12.

Memory elements 12 may be formed in a single layer in array 10 or may be formed in multiple layers. An advantage of forming memory arrays such as memory array 10 of FIG. 1 using a multi-layer memory element scheme is that this type of approach allows memory element density to be maximized.

If desired, a resistive switching metal oxide layer may be formed above or below a diode (as an example). Conductive lines 16 and 18 may be electrically coupled to metal oxide layer 22 through a number of layers of conductive material. There may, in general, be any suitable number of conductive layers associated with resistive switching memory element 12. These conductive layers may be used for functions such as adhesion promotion, seed layers for subsequent electrochemical deposition, diffusion barriers to prevent undesired materials from diffusing into adjacent structures, contact materials (e.g., metals, metal alloys, metal nitrides, etc.) for forming ohmic contacts with the metal oxide 22, contact materials (e.g., metals, metal alloys, metal nitrides, etc.) for forming Schottky contacts to the metal oxide 22, etc.

The conductive layers in memory element 12 may be formed from the same conductive material or different conductive materials. Moreover, conductive layers in memory element 12 may be formed using the same techniques or different techniques. As an example, one layer of a conductor may be formed using physical vapor deposition (PVD) techniques (e.g., sputter deposition), whereas another layer of a conductor may be formed using electrochemical deposition.

The portions of the conductive layers in memory element 12 that are immediately adjacent to metal oxide 22 or are otherwise in close association with metal oxide 22 are sometimes referred to as the electrodes of the resistive switching memory element 12.

In general, the electrodes of resistive switching memory element 12 may each include a single material (e.g., tantalum), may each include multiple materials (e.g., tantalum and titanium nitride), may include materials formed using different techniques (e.g., electrochemically deposited tantalum and PVD tantalum), or may include combinations of such materials.

Certain metal oxides are particularly appropriate for forming the resistive switching metal oxide layer 22. These metal oxides may include, for example, the transition metal oxides and mixtures thereof. In a preferred embodiment, tantalum oxide is used in forming the resistive switching metal oxide layer. In certain other embodiments, oxides and oxynitrides of tantalum, niobium, hafnium, yttrium, zirconium, lanthanum, vanadium, titanium, tungsten, nickel, aluminum, and silicon and combinations thereof can be used in forming the resistive switching metal oxide layer.

Any suitable conductive materials may be used for forming the electrodes 20 and 24 of resistive switching memory element 12. Illustrative conductive materials include transition metals (and their nitrides and oxynitrides), refractory metals (and their nitrides and oxynitrides), and noble metals. Illustrative examples of conductive materials include Ti, Ta, W, Mo, Hf, Nb, Ni, Pd, Pt, Re, Ru, and Ir. Illustrative metal nitrides include titanium nitride, tantalum nitride, niobium nitride, hafnium nitride tungsten nitride, and molybdenum nitride. These are merely illustrative examples of materials that may be used for electrodes 20 and 24. Combinations of two or more of these materials metals (and/or their nitrides and/or oxynitrides) may be used or other suitable conductive materials may be used as electrodes 20 and 24, if desired.

At least one electrode 20 or 24 is a resistive electrode. In preferred embodiments, whichever electrode is adjacent to the resistive switching memory element 12 has a suitable resistivity as discussed in detail below. In certain embodiments, both electrodes can be resistive electrodes.

The electrodes 20 and 24 and other conductive layers that may be associated with memory element 12 may be formed using any suitable techniques. Illustrative conductive material fabrication techniques include physical vapor deposition (e.g., sputter deposition, evaporation), chemical vapor deposition, atomic layer deposition, and electrochemical deposition (e.g., electroless deposition, electroplating).

Figure 7:
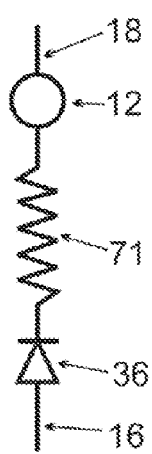
FIG. 7 is a schematic circuit diagram of an illustrative resistive switching memory element showing an embedded current steering diode and current limiting resistor.
Figure 8:
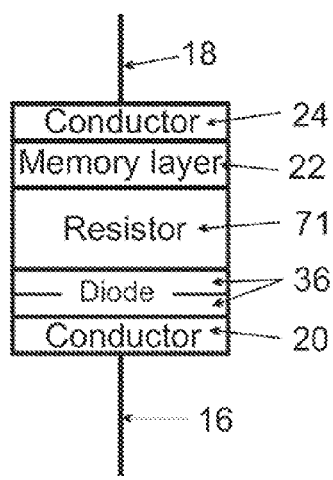
FIG. 8 is a cross-sectional view of an illustrative resistive switching nonvolatile memory element corresponding to the circuit of FIG. 7.
Figure 9:
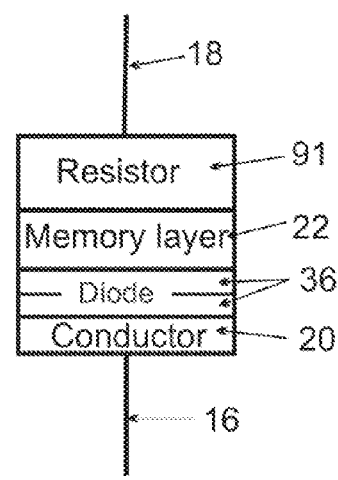
FIG. 9 is a cross-sectional view of an illustrative resistive switching nonvolatile memory element, where the top conductor included the function of the embedded resistor.

One useful device that can be added to a nonvolatile memory element is a current limiting resistor 71 as illustrated in FIG. 7. Also shown in FIG. 7 is a steering diode 36, although current limiting resistors can also be useful in memory architectures not requiring steering elements. These individual current limiting resistors can reduce the current required to set and reset the state of the resistive switching memory layer 22. Typically, the current limiting resistor is formed as a separate layer within a complete nonvolatile memory element stack as shown in FIG. 8. However, the present inventors have discovered that it is advantageous to combine the function of one electrode with the resistor function into a single layer as shown in FIG. 9, where the current limiting resistor 71 and top electrode 24 from FIG. 8 have been combined into a single resistive layer 91. References herein to a "top" or "bottom" electrode are solely for convenience and imply nothing with respect to any device orientation or the order of deposition of layers.

The set and reset operations involve breaking and reforming the conductive filaments in the resistive switching memory layer. When using metal oxides to form the memory layer, the conductive filaments comprise connected strings of oxygen vacancies within a thin oxide layer. In order to break and reform these filaments, oxygen vacancies must migrate. Adjacent material layers such as electrodes and resistors can provide a source and sink for these oxygen vacancies. It is advantageous to select materials for these adjacent layers that allow such migration to occur with minimum applied power (voltage and current). With the right choice of materials, the top electrode 91 in FIG. 9 can provide this additional function so that top electrode 91 is simultaneously (1) an electrode, (2) a current limiting resistor, and (3) a source and sink for oxygen vacancies. Therefore, in a preferred embodiment, the resistive layer is in contact with the memory layer.

Figure 10:
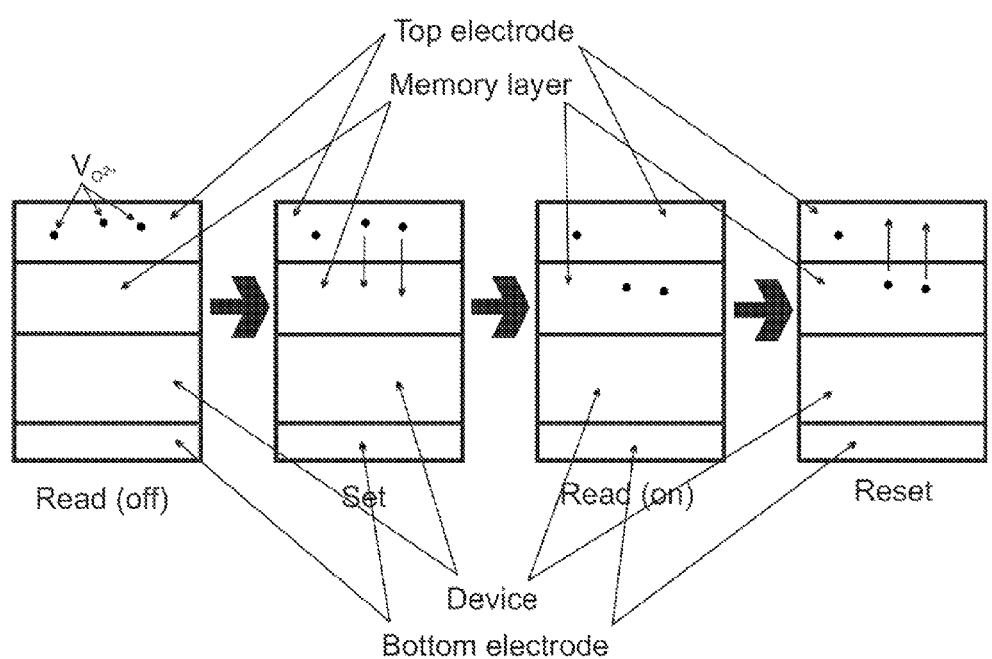
FIG. 10 is a schematic diagram showing oxygen vacancy migration during set and reset operations on a resistive switching memory layer.

FIG. 10 shows schematically how oxygen vacancies can migrate in and out of a metal oxide memory layer as voltages are cycled. When $V_{set}$ is applied, oxygen vacancies are drawn from the top electrode into the memory layer, and when $V_{reset}$ is applied, the oxygen vacancies return to the top electrode. The "device" layer shown could represent a steering diode which is not a good source or sink of oxygen vacancies.

The material requirements for a multifunction electrode depend on the design architecture of a specific memory array. For example, consider a 43 nm square (area A=$43^2$ nm$^2$) memory element with a 100 Å (length L=10 nm) thick top electrode. A typical target resistance for the current limiting function is R=100-200 kΩ. The required resistivity is given by $\rho$=R(A/L)=R($43^2$/10)=18,490-36,980 Ωnm≅1.8-3.7 Ωcm. To provide for good design latitude and accommodate newer fabs with line widths down to about 10 nm, this range can be expanded; generally, it is desired to be able to tune the resistivity of a top electrode material in the range 0.1-10 Ωcm.

In accordance with one or more embodiments of the present invention, a nonvolatile memory element comprises a resistive switching memory layer having bistable resistance formed between a first electrode layer and a second electrode layer, with an optional steering element such as a p-i-n diode between one electrode layer and the memory layer. The nonvolatile memory element comprises a first layer operable as a first electrode, and a second layer operable as a resistive switching layer. The second layer comprises a compound comprising $Me^1{}_vMe^2{}_wSi_xO_yN_z$, where $Me^1$ and $Me^2$ are metals, v≥0, w≥0, x≥0, y>0, and z≥0, and at least one of v, w, and x is greater than zero, having near-stoichiometric composition and bistable resistance. In some embodiments, the second layer comprises a transition metal oxide or transition metal oxynitride. The memory element further comprises a third layer, wherein the third layer is operable as a second electrode. At least one of the first layer or the third layer is a resistive layer comprising a substoichiometric nitride or substoichiometric oxynitride, and having a resistivity between 0.1 and 10 Ωcm. In some embodiments, the resistive layer comprises a transition metal nitride or transition metal oxynitride. The transition metals can comprise hafnium, tantalum, zirconium, lanthanum, niobium, or tungsten. The metals, $Me^1$ and $Me^2$, can each be selected from the group consisting of tantalum, niobium, hafnium, yttrium, zirconium, lanthanum, vanadium, titanium, tungsten, nickel, and aluminum.

In some embodiments, the resistive layer is in contact with the second layer. In some embodiments, both the first layer and the third layer are resistive layers. In some embodiments, the resistive layer is operable as a source of oxygen vacancies that can migrate into the second layer during the set cycle, and is operable as a sink for oxygen vacancies that can migrate out of the second layer during the reset cycle.

Many electrode materials can be used as described above. For example, a conductive electrode layer can be formed from a doped polycrystalline silicon layer, and another conductive or resistive electrode layer can be formed from a metal nitride. Metal nitride layers are frequently chosen for electrodes, because they are stable, have good conductivity, are easy and inexpensive to form. TiN is a common choice, partly because it is a particularly good conductor. For the present purposes, where some resistivity is desired, other transition metal nitrides, for example, nitrides of tantalum, hafnium, and niobium can be more suitable.

In some embodiments, ReRAM devices comprising an array of nonvolatile memory elements can be prepared. The first electrode layers of each nonvolatile memory element are coplanar and arranged as a first set of parallel electrodes, and the second electrode layers of each nonvolatile memory element are coplanar and arranged as a second set of parallel electrodes at an angle to the first set of parallel electrodes.

Methods of Forming Resistive Nitrides

In certain embodiments, methods of forming a nonvolatile memory element comprise forming a first layer, operable as a first electrode, and forming a second layer, operable as a resistive memory layer and comprising a near-stoichiometric metal oxide having bistable resistance. The methods further comprise forming a third layer, operable as a second electrode. The memory layer is disposed between the first and second electrode layers. At least one of the electrode layers is a resistive layer comprising a sub-stoichiometric transition metal nitride or oxynitride, having a resistivity between 0.1 and 10 Ωcm. Both the first and third layers can be resistive layers. Preferably, the resistive layer is in contact with the memory layer. The second layer comprises a compound comprising $Me^1{}_v Me^2{}_w Si_x O_y N_z$, where $Me^1$ and $Me^2$ are metals, v≥0, w≥0, x≥0, y>0, and z≥0, and at least one of v, w, and x is greater than zero, having near-stoichiometric composition and bistable resistance. In some embodiments, the resistive layer comprises a transition metal nitride or transition metal oxynitride. The transition metals can comprise hafnium, tantalum, zirconium, lanthanum, niobium, or tungsten. The metals, $Me^1$ and $Me^2$, can each be selected from the group consisting of tantalum, niobium, hafnium, yttrium, zirconium, lanthanum, vanadium, titanium, tungsten, nickel, and aluminum.

The substoichiometric nitride or substoichiometric oxynitride can be formed by reactive sputtering in an atmosphere comprising nitrogen or a combination of nitrogen and oxygen. In order to form nitride layers with well-controlled resistivity, it is desirable to operate in a parameter space where the resistivity changes slowly with one or more process parameters. In some cases, commonly used ranges of process parameters fail to provide the required level of control, because the resistivity of layers is too steep a function of the available process parameters. Alternate approaches can be helpful to provide process parameters such that the resistivity of layers can be well-controlled. Three methods are provided that can improve process control parameters for reactive sputtering of metal nitride layers.

Figure 11:
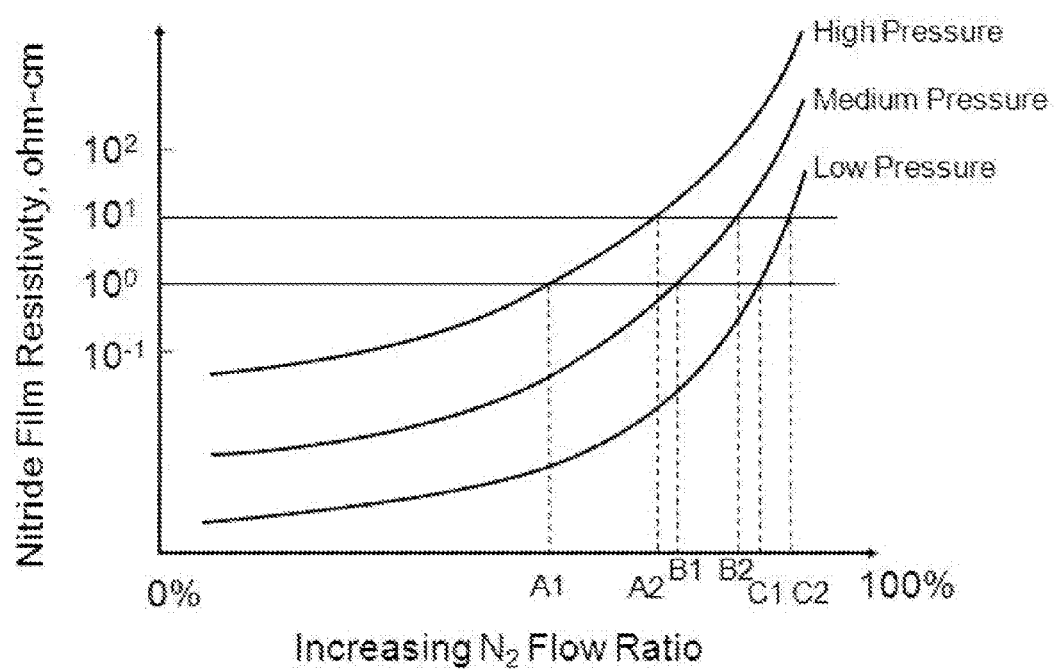
FIG. 11 shows simulated data for resistivity as a function of sputtering chamber pressure.

According to the first method, the pressure in the sputtering chamber is increased significantly from the normal operating point. In some embodiments, the atmosphere has a total pressure between about 10 and about 50 mTorr. Typically, to form a metal nitride using dc reactive sputtering, an $Ar/N_2$ atmosphere at 1-5 mTorr is used. The nitrogen content of the formed layer can be varied by varying the $N_2$ concentration in the $Ar/N_2$ atmosphere. The resulting layer resistivity is shown qualitatively in FIG. 11, where the "Low Pressure" curve corresponds roughly to typical operating conditions. (Data shown are simulations and do not represent real data for any particular metal nitride, sputtering power, or any particular operating pressure.) For the "Low Pressure" curve, the resistivity in the target range of 0.1-10 Ωcm is a steep function of the nitrogen flow rate in a range C1-C2, and accurate control of resistivity would be very difficult. However, the curves shift and flatten with increasing pressure, and the useful control range broadens to B1-B2 at "Medium Pressure" and further to A1-A2 at "High Pressure." Exemplary pressures suitable for the higher operating pressures are in the range 10-50 mTorr.

Figure 12:
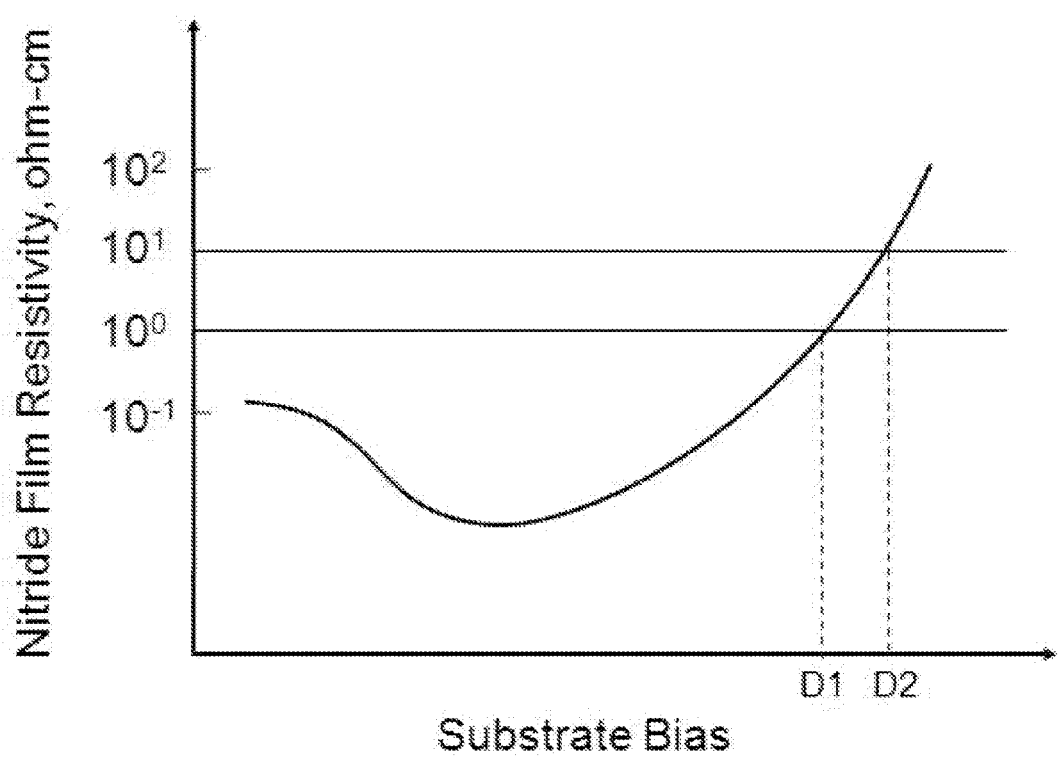
FIG. 12 shows simulated data for resistivity as a function of sputtering chamber substrate bias voltage.

According to the second method, the substrate bias applied during sputtering is adjusted in an abnormal way. In some embodiments, the substoichiometric nitride or substoichiometric oxynitride can be formed by reactive sputtering wherein a substrate bias voltage is set substantially higher (more than 20%) than the bias voltage at which a minimum resistivity occurs in the substoichiometric transition metal nitride or substoichiometric oxynitride. A typical (simulation) example of how nitride layer resistivity varies with substrate bias is shown in FIG. 12. In normal operation, the substrate bias is selected to maximize layer density through ion bombardment. Maximum layer density correlates with minimum layer resistivity. The layer density (and therefore resistivity) decreases to either side of this "optimum" substrate bias. In both directions, the defect density in the layer increases. While there is a limit to the defect density that can be achieved at low substrate bias, there is no such limit to the high side, and, in principle, arbitrary layer resistivity can be achieved. For example, in the simulated example of FIG. 12, a useful process range is found for substrate biases between D1 and D2, both substantially above the bias at which resistivity is minimized. In practice, depending on other process parameters, the curve may become too steep in the target range, and this method can usefully be combined with the first and/or third methods to optimize process control.

Figure 13:
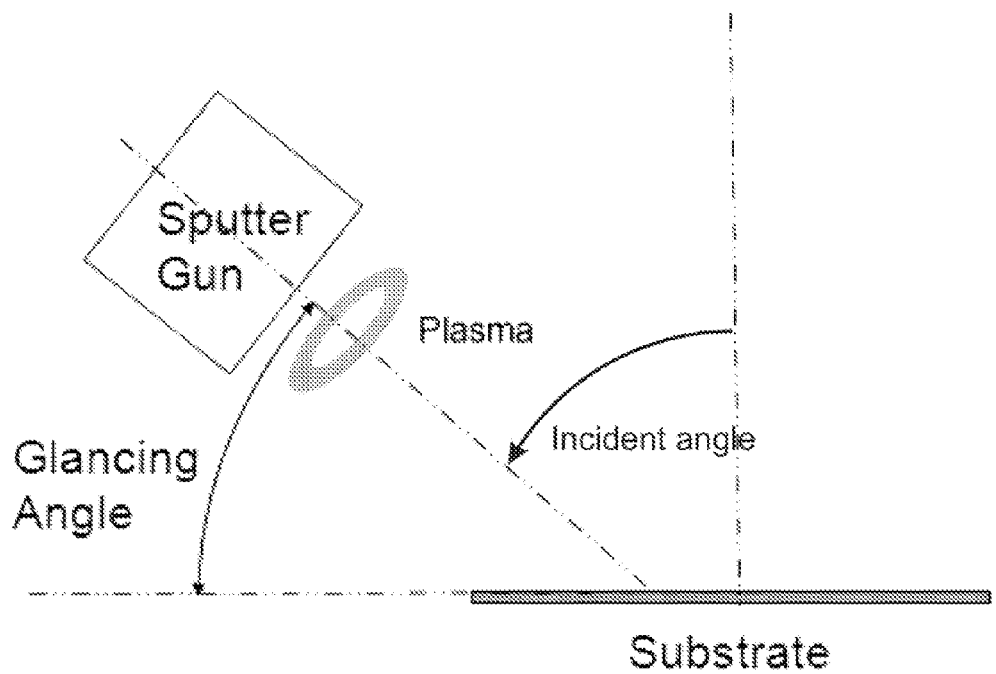
FIG. 13 shows sputtering at an oblique angle.
Figure 14:
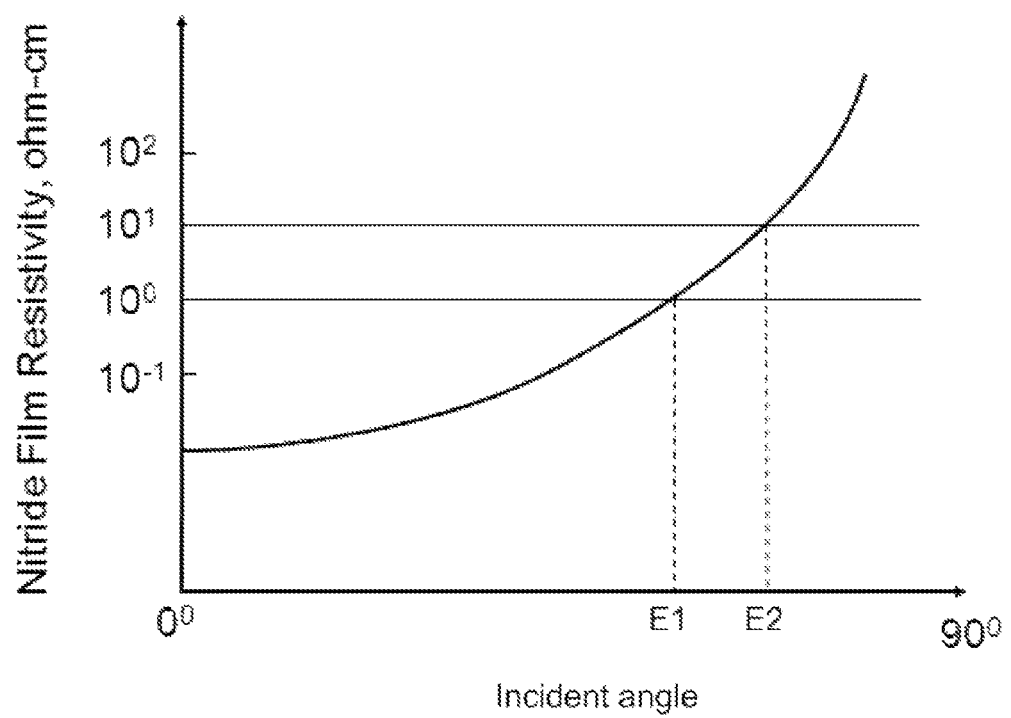
FIG. 14 shows simulated data for resistivity as a function of sputtering angle.

According to the third method, as shown in FIG. 13, the sputter gun is positioned at an oblique angle. The typical position of the sputter gun is directly overhead at 90° from the substrate plane. In some embodiments, the substoichiometric nitride or substoichiometric oxynitride can be formed by reactive sputtering wherein the sputtered atoms impinge on the growing second electrode layer at an incident angle greater than about 55° relative to the surface normal (e.g., from about 55° to about 85° relative to the surface normal). As shown qualitatively in FIG. 14, the reduced normal momentum from atoms incident at a glancing angle can also increase defect density and therefore resistivity to provide an additional control parameter.

In order to tune the resistivity of a nitride, one can form a substoichiometric composition where there is excess nitrogen in the formed layer. Depending on the particular metal used, the detailed composition of such a layer can vary. Most transition metals have multiple possible valence states even if one predominates, and a mixture of nitrides of different stoichiometry can be formed. For example, up to seven forms of tantalum nitride were found in layers formed by ion-beam assisted deposition (IBAD). In order of increasing nitrogen content, these were cubic $\beta$-$TaN_{0.05}$, hexagonal $\gamma$-$Ta_2N$, hexagonal $\delta$-TaN, hexagonal $\epsilon$-TaN, hexagonal $Ta_5N_6$, tetragonal $Ta_4N_5$, and tetragonal $Ta_3N_5$ (see, for example, Arranz & Palacio, "Composition of tantalum nitride thin films grown by low-energy nitrogen implantation: a factor analysis study of the Ta 4f XPS core level," available online at arxiv.org/ftp/cond-mat/papers/0409/0409712.pdf).

As discussed in Example 1, tantalum nitride layers can be made by reactive sputtering in an $Ar/N_2$ atmosphere with varying concentrations of $N_2$. Resistivities could be achieved in the range of interest (0.1-10 Ωcm) using a nitrogen flow rates above about 50%. (All relative concentrations are by volume, set as a volume flow rate such as standard cubic centimeters per minute [sccm].) However, other researchers (e.g., Nazon, J. et al., "Effects of processing parameters on the properties of tantalum nitride thin films deposited by reactive sputtering," *J. Alloys and Compounds*, 464: 526-31, 2008) have reported bulk resistivities for tantalum nitride that cover the desired range. Nazon (FIG. 6 therein) found resistivities for sputtered layers with the desired range for $N_2$ concentrations of about 4-8% for 90 W sputtering power and a constant Ar pressure of 6.5 Pa (49 mTorr).

Hafnium nitride layers can also be made in the appropriate resistivity range. Preliminary sputtering experiments at 100 W and 5 mTorr indicated that the desired resistivity range could be obtained for $N_2$ concentrations in the range ~10-16%. Hafnium appears to have at least two stable nitrides, a conductive HfN and a much more resistive $Hf_3N_4$.

In accordance with one or more embodiments of the present invention, the resistivity of a compound comprising a metal and nitrogen can be further increased by adding oxygen to form an oxynitride of variable stoichiometry. Metal oxides are typically poor conductors, while metal nitrides are typically good conductors. Oxynitrides can exhibit intermediate conductivity by providing limited electron conduction paths through the nitride regions.

In accordance with some embodiments, the substoichiometric nitride or substoichiometric oxynitride can be formed using atomic layer deposition using appropriate precursors and oxygen reactant gas concentration, nitrogen reactant gas concentration, and exposure times. In accordance with some embodiments, the substoichiometric nitride or substoichiometric oxynitride can also be formed using chemical vapor deposition using appropriate precursors and oxygen-containing gas concentration, nitrogen-containing gas concentration, and exposure times. Typical precursors include tetrakis(dimethylamino)hafnium as a Hf precursor, pentakis(dimethylamino)tantalum as a Ta precursor, and tris(dimethylamino)silane) as a Si precursor.

EXAMPLE

Example 1

Tantalum Nitride Resistivity for Layers Made by Reactive Sputtering

Tantalum nitride, hafnium nitride, and tantalum silicon nitride layers were prepared using either PVD (dc reactive sputtering at 200 W in a 5 mTorr Ar/$N_2$ atmosphere with varying $N_2$ flow rates) or ALD (using alternating pulses of a metal precursor and $NH_3$ at a substrate temperature of 200-260 C; metal precursors included tetrakis(dimethylamino)hafnium as a Hf precursor, pentakis(dimethylamino)tantalum as a Ta precursor, and tris(dimethylamino)silane) as a Si precursor.

Samples of TaN produced by PVD with a nitrogen flow rate above about 50% generally had resistivities in the range of interest (0.1-10 $\Omega$cm) as did the TaSiN sample. HfN samples showed useful resistivities for nitrogen flow rates in the range 10-15%. The data suggest that the resistive layers comprising a sub-stoichiometric nitride or sub-stoichiometric oxynitride having the desired current limiting resistivity for any particular device design can be prepared when using an appropriate choice of process conditions.

It will be understood that the descriptions of one or more embodiments of the present invention do not limit the various alternative, modified and equivalent embodiments which may be included within the spirit and scope of the present invention as defined by the appended claims. Furthermore, in the detailed description above, numerous specific details are set forth to provide an understanding of various embodiments of the present invention. However, one or more embodiments of the present invention may be practiced without these specific details. In other instances, well known methods, procedures, and components have not been described in detail so as not to unnecessarily obscure aspects of the present embodiments.

What is claimed is:

1. A method of forming a nonvolatile memory element, the method comprising:
   forming a first layer operable as a first electrode; and
   forming a second layer operable as a resistive switching layer;
   wherein the first layer comprises a sub-stoichiometric nitride or a sub-stoichiometric oxynitride formed by reactive sputtering in an atmosphere comprising nitrogen or a combination of nitrogen and oxygen; and
   wherein the second layer comprises a compound having a near-stoichiometric composition and a bi-stable resistance.

2. The method of claim 1, wherein the reactive sputtering comprises applying a bias to a substrate; and wherein the bias is 20% higher than a minimum reactivity bias for the sub-stoichiometric nitride or the sub-stoichiometric oxynitride.

3. The method of claim 1, wherein a sputter gun used for the reactive sputtering is positioned at an oblique angle relative to a substrate surface.

4. The method of claim 3, wherein the sputter gun is positioned at an angle of greater than about 55° relative to a normal to the substrate surface.

5. The method of claim 4, wherein the sputter gun is positioned at an angle of between about 55° and about 85° relative to the normal to the substrate surface.

6. The method of claim 1, wherein the sub-stoichiometric nitride comprises a mixture of nitrides of different stoichiometries.

7. The method of claim 6, wherein the mixture of nitrides comprises a mixture of titanium nitrides of different stoichiometries.

8. The method of claim 6, wherein the mixture of nitrides comprises two or more of cubic $\beta$-$TaN_{0.05}$, hexagonal $\gamma$-$Ta_2N$, hexagonal $\delta$-TaN, hexagonal $\epsilon$-TaN, hexagonal $Ta_2N_6$, tetragonal $Ta_4N_5$, or tetragonal $Ta_3N_5$.

9. The method of claim 1, wherein the first layer has a resistivity of between about 0.1 $\Omega$cm and 10 $\Omega$cm.

10. The method of claim 1, wherein the atmosphere during reactive sputtering has a concentration of nitrogen of greater than about 50%.

11. The method of claim 1, wherein the sub-stoichiometric nitride comprises hafnium nitride.

12. The method of claim 1, wherein the sub-stoichiometric nitride comprises a mixture of hafnium nitrides of different stoichiometries.

13. The method of claim 1, wherein the sub-stoichiometric nitride comprises a mixture of HfN and $Hf_3N_4$.

14. The method of claim 1, wherein the first layer comprises the sub-stoichiometric oxynitride.

15. The method of claim 1, wherein the sub-stoichiometric nitride comprises tantalum silicon nitride.

16. The method of claim 1, further comprising a third layer operable as a second electrode, wherein the second layer is disposed between the first layer and the third layer, wherein the first layer has a resistivity of between about 0.1 $\Omega$cm and 10 $\Omega$cm, and wherein the third layer has a resistivity of between about 0.1 $\Omega$cm and 10 $\Omega$cm.

17. The method of claim 1, wherein the second layer is in contact with the first layer.

18. The method of claim 1, wherein the compound comprises $Me^1{}_v Me^2{}_w Si_x O_y N_z$, wherein $Me^1$ and $Me^2$ are metals, $v \geq 0$, $w \geq 0$, $x \geq 0$, $y > 0$, and $z \geq 0$, and at least one of v, w, and x is greater than zero.

19. The method of claim 1, wherein the first layer is operable as a source of oxygen vacancies such that the oxygen vacancies migrate from the first layer and into the second layer during a set cycle, and wherein the first layer is further operable as a sink for oxygen vacancies such that the oxygen vacancies migrate out of the second layer and into the first layer during a reset cycle.

20. The method of claim 1, wherein the sub-stoichiometric nitride or the sub-stoichiometric oxynitride comprises one of hafnium, tantalum, zirconium, lanthanum, niobium, or tungsten.

* * * * *